United States Patent
Fujita et al.

(10) Patent No.: US 11,362,255 B2
(45) Date of Patent: Jun. 14, 2022

(54) HEAT FLOW SWITCHING ELEMENT

(71) Applicants: MITSUBISHI MATERIALS CORPORATION, Tokyo (JP); TOYOTA SCHOOL FOUNDATION, Nagoya (JP)

(72) Inventors: Toshiaki Fujita, Naka (JP); Koya Arai, Naka (JP); Tsunehiro Takeuchi, Nagoya (JP); Takuya Matsunaga, Nagoya (JP)

(73) Assignees: MITSUBISHI MATERIALS CORPORATION, Tokyo (JP); TOYOTA SCHOOL FOUNDATION, Nagoya (JP)

(*) Notice: Subject to any disclaimer, the term of this patent is extended or adjusted under 35 U.S.C. 154(b) by 56 days.

(21) Appl. No.: 16/830,847

(22) Filed: Mar. 26, 2020

(65) Prior Publication Data
US 2021/0249581 A1 Aug. 12, 2021

(30) Foreign Application Priority Data

Feb. 6, 2020 (JP) .............................. JP2020-018678

(51) Int. Cl.
*H01L 35/32* (2006.01)
*H01L 23/34* (2006.01)
(Continued)

(52) U.S. Cl.
CPC .............. *H01L 35/32* (2013.01); *H01L 23/34* (2013.01); *H01L 35/04* (2013.01); *H01L 35/08* (2013.01); *H01L 35/10* (2013.01); *H01L 35/30* (2013.01)

(58) Field of Classification Search
CPC ......... H01L 35/04; H01L 35/30; H01L 35/32; H01L 35/02; H01L 35/08; H01L 35/10; H01L 35/28–325
See application file for complete search history.

(56) References Cited

U.S. PATENT DOCUMENTS 6,107,645 A * 8/2000 Hidaka ................... H01L 33/62
136/239
6,232,542 B1 * 5/2001 Hiraishi ................. H01L 35/34
136/201
(Continued)

FOREIGN PATENT DOCUMENTS

| JP | 2781892 B2 | 7/1998 |
| JP | 5402346 B2 | 1/2014 |
| JP | 2016-216688 A | 12/2016 |

OTHER PUBLICATIONS

Matsunaga, Takuya et al., "Thermal Switching Device Operating with Bias Voltage," The 15th Annual Meeting of Thermoelectric Society of Japan, Sep. 13, 2018, pp. 89, information page and English abstract thereof.

*Primary Examiner* — Scott B Geyer
(74) *Attorney, Agent, or Firm* — Locke Lord LLP

(57) ABSTRACT

Provided is a heat flow switching element which has a larger change in a thermal conductivity and has excellent thermal responsiveness. The heat flow switching element includes an N-type semiconductor layer, an insulator layer laminated on the N-type semiconductor layer, a P-type semiconductor layer laminated on the insulator layer, an N-side electrode connected to the N-type semiconductor layer, and a P-side electrode connected to the P-type semiconductor layer. In particular, the insulator layer is formed of a dielectric. Also, a plurality of N-type semiconductor layers and P-type semiconductor layers are laminated alternately with the insulator layer interposed therebetween.

6 Claims, 5 Drawing Sheets

(51) Int. Cl.
  *H01L 35/30* (2006.01)
  *H01L 35/10* (2006.01)
  *H01L 35/04* (2006.01)
  *H01L 35/08* (2006.01)

(56) References Cited

U.S. PATENT DOCUMENTS

| | | | |
|---|---|---|---|
| 9,960,338 B2* | 5/2018 | Nakamura | H01L 35/32 |
| 2007/0217120 A1* | 9/2007 | Sallese | B81B 3/0054 |
| | | | 361/278 |
| 2010/0258155 A1* | 10/2010 | Lee | H01L 35/32 |
| | | | 136/203 |
| 2011/0247668 A1* | 10/2011 | Bell | F02G 1/043 |
| | | | 136/200 |
| 2013/0014798 A1* | 1/2013 | Nishide | H01L 35/32 |
| | | | 136/205 |
| 2013/0118541 A1* | 5/2013 | Lee | H01L 35/34 |
| | | | 136/200 |
| 2013/0226303 A1* | 8/2013 | Messerli | A61B 17/1659 |
| | | | 623/17.16 |
| 2015/0212386 A1* | 7/2015 | Patel | G02B 6/132 |
| | | | 385/3 |
| 2016/0170241 A1* | 6/2016 | Adams | G02F 1/025 |
| | | | 385/2 |
| 2018/0248097 A1* | 8/2018 | Hayashi | H01L 35/22 |
| 2018/0287037 A1* | 10/2018 | Maekawa | H01L 35/22 |
| 2021/0072460 A1* | 3/2021 | Zhang | G02F 1/025 |
| 2021/0249577 A1* | 8/2021 | Fujita | H01L 35/30 |
| 2021/0272810 A1* | 9/2021 | Arima | H01L 21/248 |

* cited by examiner

[Fig. 1]
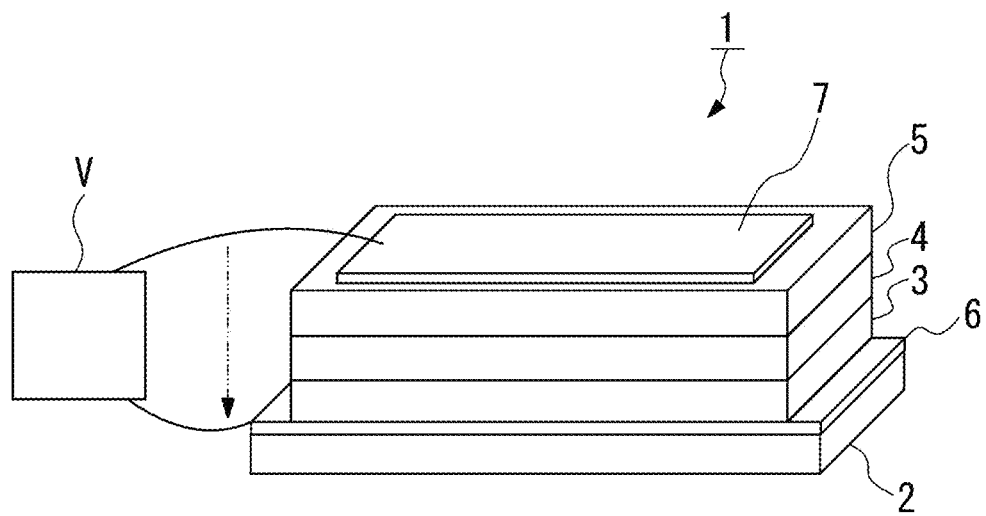
[Fig. 2]
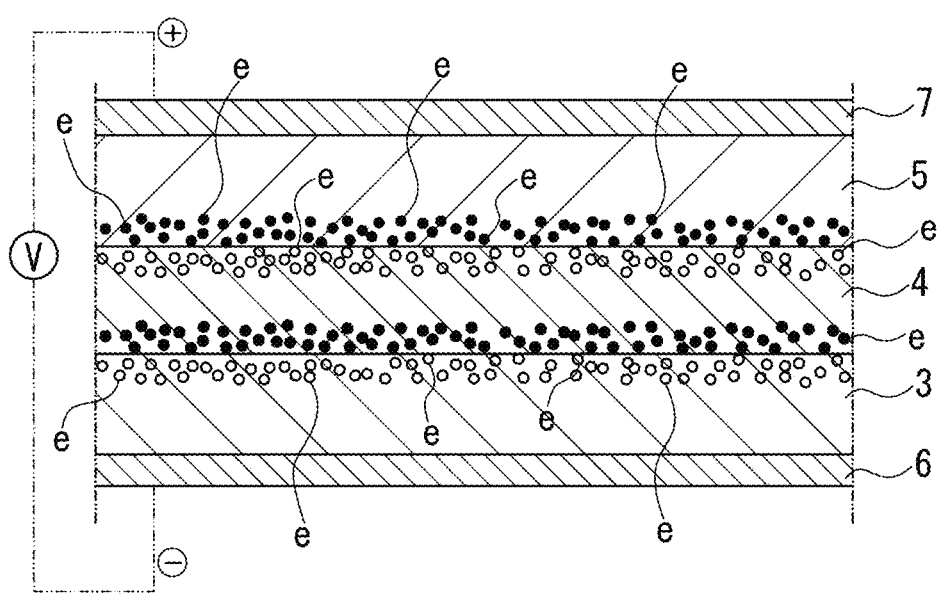

[Fig. 3]
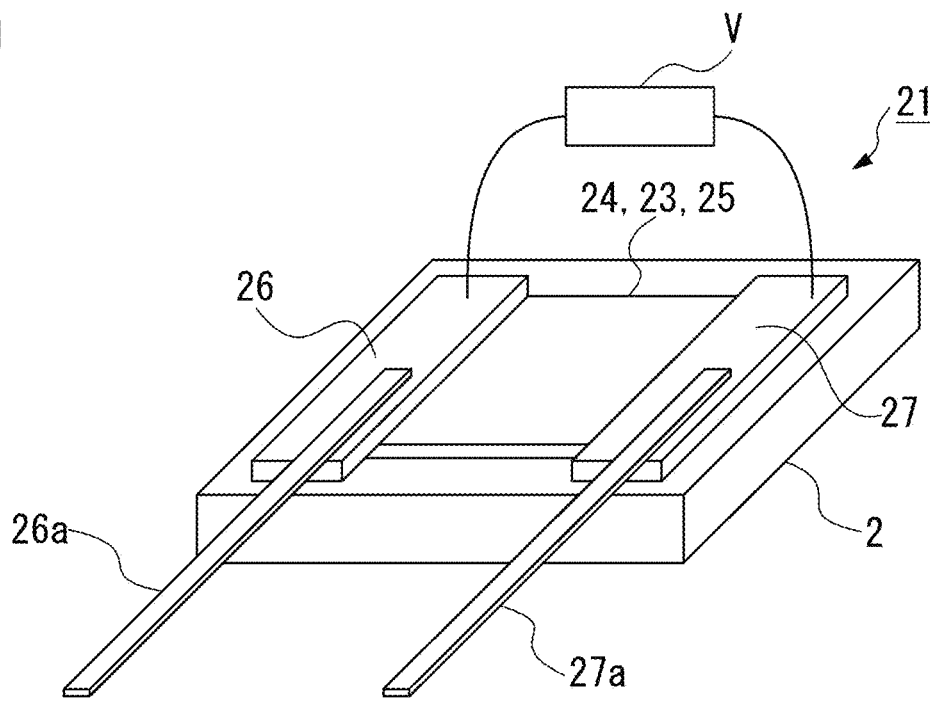
[Fig. 4]
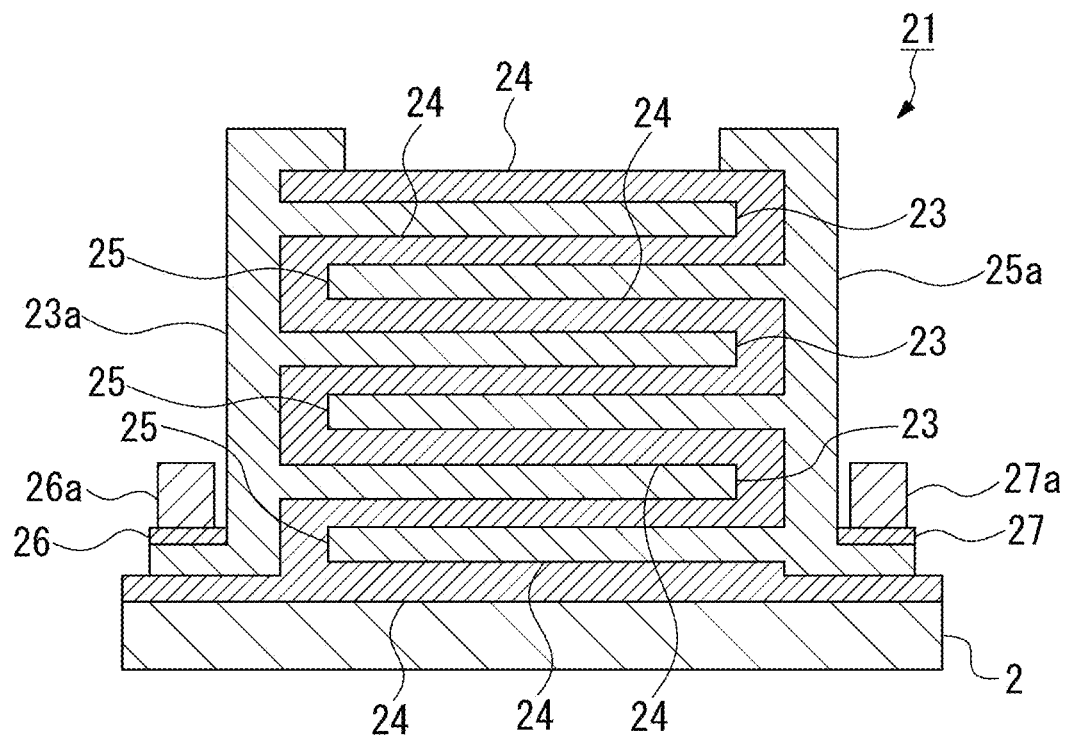

[Fig. 5]
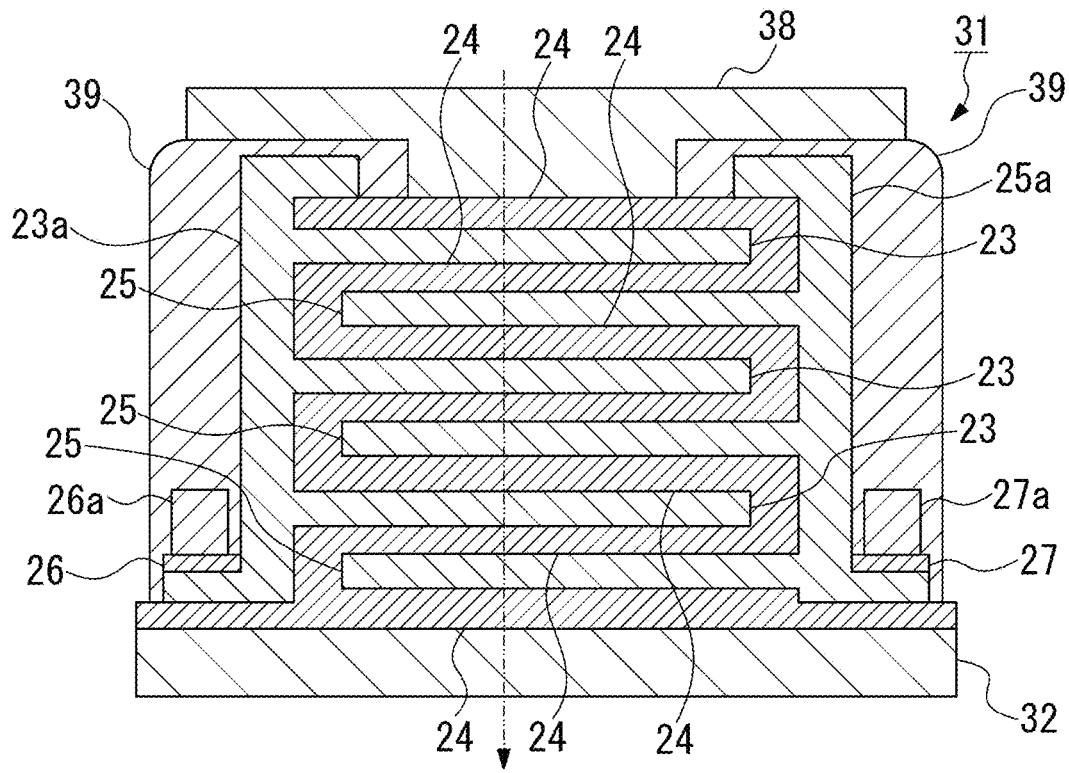
[Fig. 6]
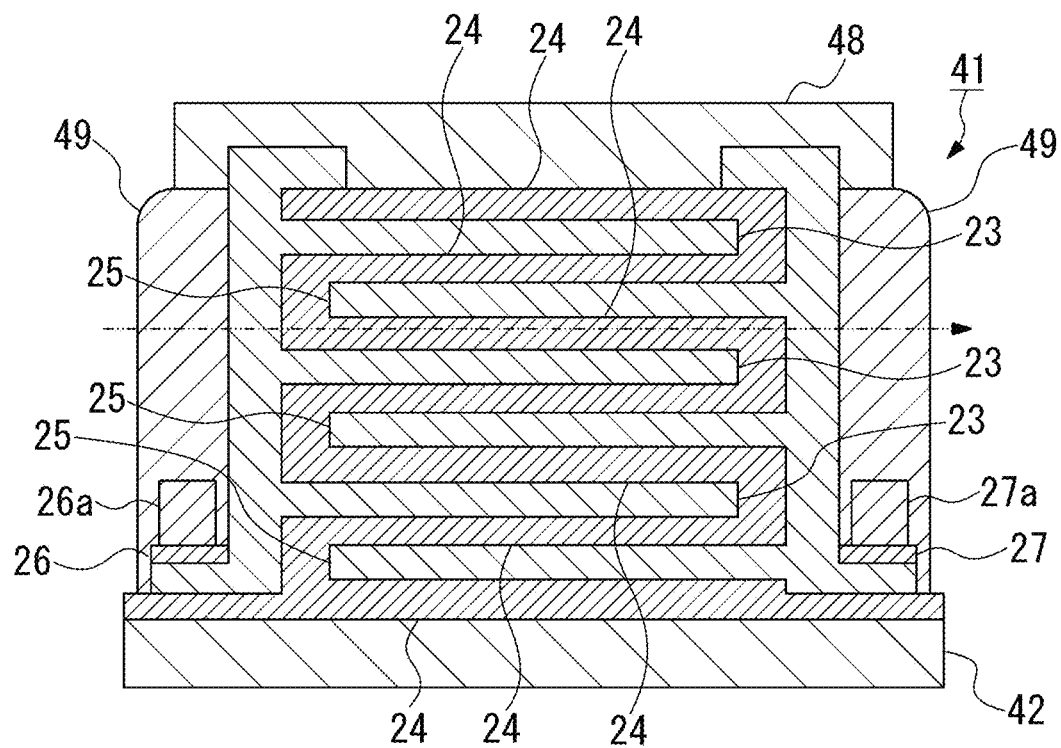

[Fig. 7]
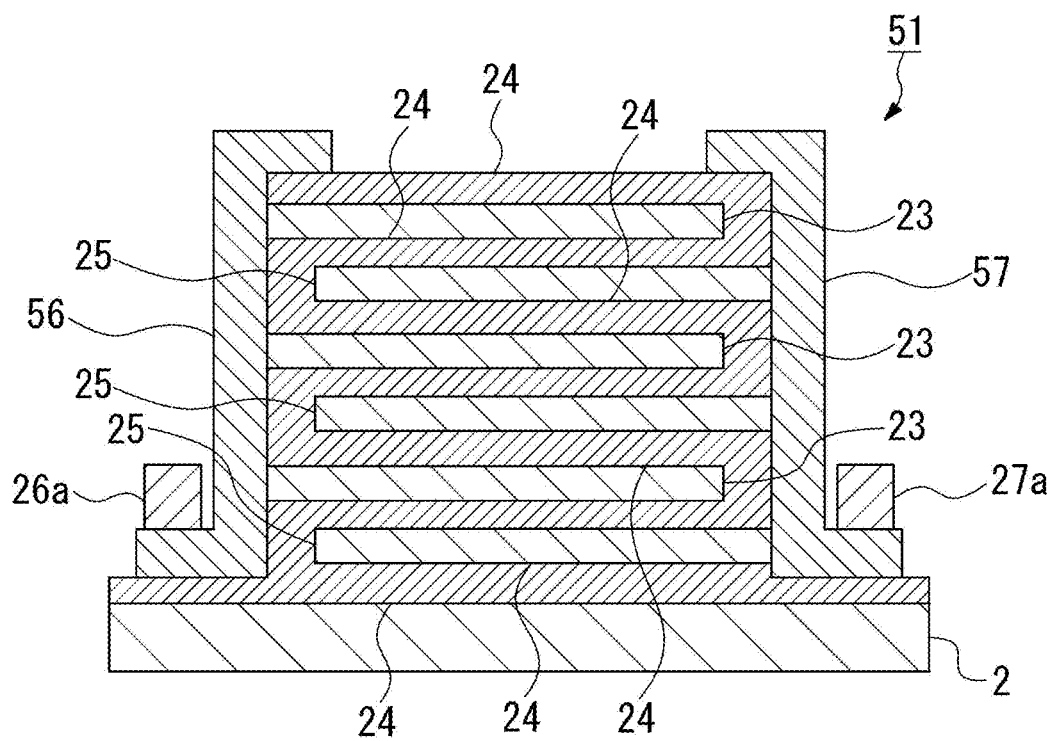
[Fig. 8]
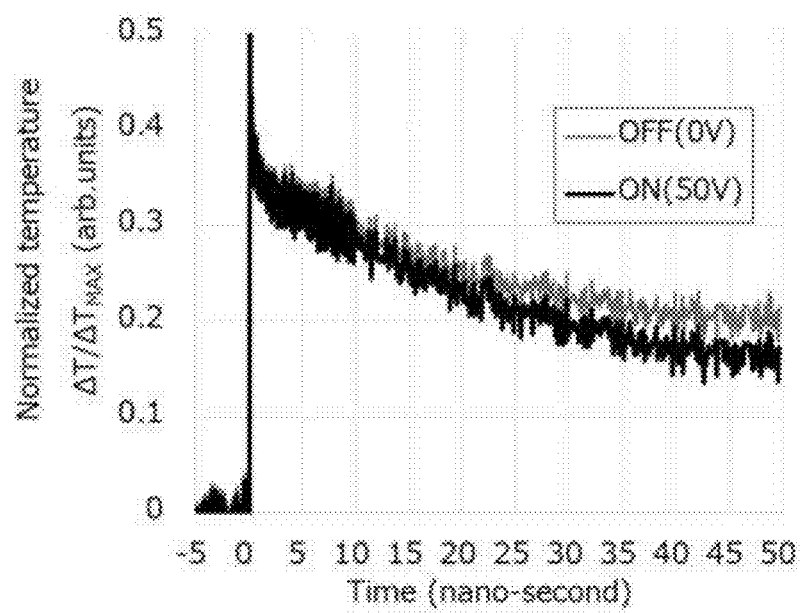

[Fig. 9]
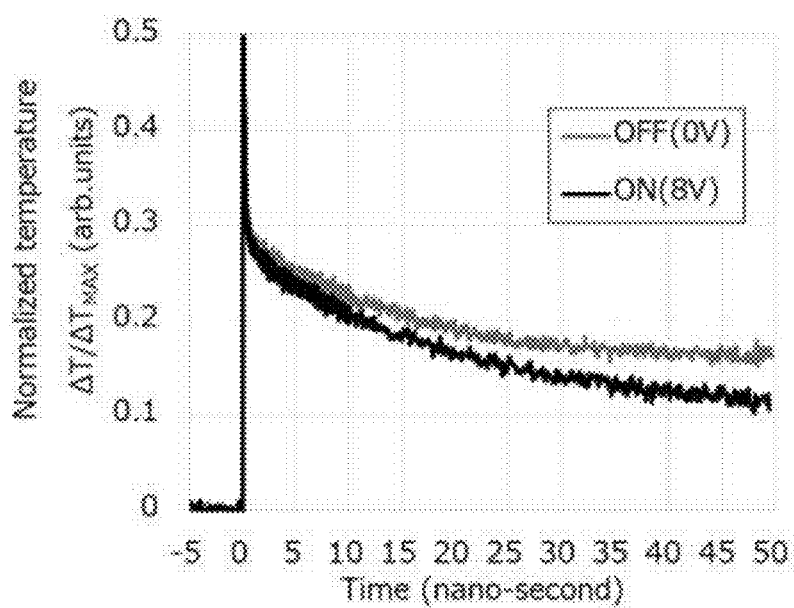

HEAT FLOW SWITCHING ELEMENT

CROSS REFERENCE TO RELATED APPLICATIONS

This application is related to co-pending application: "HEAT FLOW SWITCHING ELEMENT" filed even date herewith in the names of Toshiaki FUJITA, Koya ARAI, Tsunehiro TAKEUCHI and Takuya MATSUNAGA, which claims priority to Japanese Application No. 2020-018679, filed Feb. 6, 2020; the above-identified application is assigned to the assignee of the present application and is incorporated by reference herein.

BACKGROUND OF THE INVENTION

Field of the Invention

The present invention relates to a heat flow switching element which can actively control thermal conduction with a bias voltage.

Description of Related Art

Conventionally, as a thermal switch for changing a thermal conductivity, for example, Patent Document 1 discloses a thermal diode in which two thermal conductors having different thermal expansion coefficients are lightly brought into contact with each other to change a flow of heat depending on a direction of a temperature gradient. Further, Patent Document 2 also discloses a heat radiating device which is a thermal switch using physical thermal contact due to thermal expansion.

Further, Patent Document 3 discloses a thermal conduction variable device in which a thermal conductivity is changed by a reversible oxidation-reduction reaction generated by applying a voltage to a compound.

Furthermore, Non-Patent Document 1 proposes a heat flow switching element in which a thermal conductivity is changed by sandwiching a polyimide tape between two sheets of $Ag_2S_{0.6}Se_{0.4}$ and applying an electric field.

PATENT DOCUMENTS

[Patent Document 1] Japanese Patent No. 2781892
[Patent Document 2] Japanese Patent No. 5402346
[Patent Document 3] Japanese Unexamined Patent Application Publication No. 2016-216688

Non-Patent Documents

[Non-Patent Document 1] Matsunaga Takuya and four others, "Thermal Switching Device Operating with Bias Voltage," The 15th Annual Meeting of the Thermoelectric Society of Japan, Sep. 13, 2018.

SUMMARY OF THE INVENTION

The following problems remain in the above-described conventional technology.

That is, in the techniques described in Patent Documents 1 and 2, since the physical thermal contact due to the thermal expansion is used, reproducibility cannot be obtained, in particular, it is difficult to design a size due to a minute change, and it is not possible to avoid plastic deformation due to a mechanical contact pressure. Also, there is a problem that an influence of convective heat transfer between materials is too large.

Further, in the technique described in Patent Document 3, there is a problem that an oxidation-reduction reaction which is a chemical reaction is used and thermal conduction is not stable due to poor thermal responsiveness.

On the other hand, in the technology described in Non-Patent Document 1, since a thermal conductive electric charge is generated at a material interface by apply a voltage, and heat can be carried by the electric charge, it is possible to immediately shift to a state in which thermal conduction has changed, and it is possible to obtain relatively good thermal responsiveness. However, since an amount of generated electric charge is small, a heat flow switching element that increases the amount of generated electric charge and has a larger change in the thermal conductivity is desired.

The present invention has been made in view of the above-described problems, and an object thereof is to provide a heat flow switching element which has a larger change in a thermal conductivity and has excellent thermal responsiveness.

The present invention has the following features to solve the above-described problems. That is, a heat flow switching element according to a first invention includes an N-type semiconductor layer, an insulator layer which is laminated on the N-type semiconductor layer, and a P-type semiconductor layer which is laminated on the insulator layer.

Since the heat flow switching element includes the N-type semiconductor layer, the insulator layer which is laminated on the N-type semiconductor layer, and the P-type semiconductor layer which is laminated on the insulator layer, when an external voltage is applied to an N-side electrode and a P-side electrode, electric charges are induced mainly at interfaces between the P-type semiconductor layer and the insulator layer, and at interfaces between the N-type semiconductor layer and the insulator layer, respectively, a thermal conductivity is changed by the electric changes transferring heat. In particular, since the electric charges are generated both at the interface between the N-type semiconductor layer and the insulator layer and in the vicinity thereof, and at the interface between the P-type semiconductor layer and the insulator layer and in the vicinity thereof, an amount of generated electric charges is large, and a large change in the thermal conductivity and high thermal responsiveness can be obtained. Further, since it is a mechanism which physically changes the thermal conductivity without using a chemical reaction mechanism, a shift toward a state in which the thermal conductivity has changed can be immediately performed, and good thermal responsiveness can be obtained.

Further, since the amount of electric charges induced to the interfaces changes according to a magnitude of the external voltage, the thermal conductivity can be adjusted by adjusting the external voltage, and a heat flow can be actively controlled through the element.

Since the insulator layer has an electric insulation characteristics, and an electric current due to voltage application is not generated, Joule heat does not occur. Therefore, the heat flow can be actively controlled without self-heating.

In the first embodiment, a heat flow switching element according to a second invention may further include an N-side electrode which is connected to the N-type semiconductor layer, and a P-side electrode which is connected to the P-type semiconductor layer.

According to a heat flow switching element of a third invention, in the first or second invention, the insulator layer is formed of a dielectric.

That is, in the heat flow switching element, since the insulator layer is formed of a dielectric, in the interfaces between the P-type semiconductor layer and the insulator layer, and in the interfaces between the N-type semiconductor layer and the insulator layer, respectively, the electric charges are also generated on the insulator layer side which is a dielectric, and thus a larger change in the thermal conductivity and higher thermal responsiveness can be obtained.

According to a heat flow switching element of a fourth invention, in any one of the first to third inventions, a plurality of N-type semiconductor layers and P-type semiconductor layers may be alternately laminated with the insulator layer interposed therebetween.

That is, in the heat flow switching element, since the N-type semiconductor layers and the P-type semiconductor layers are alternately laminated with the insulator layer interposed therebetween, the amount of electric charges generated along the interface of which the number is increased by lamination also increases, and thus a larger change in the thermal conductivity and higher thermal responsiveness can be obtained.

In any one of the first to fourth inventions, a heat flow switching element of a fifth invention may further include an upper high thermal conductive portion which is provided on an uppermost surface, a lower high thermal conductive portion which is provided on a lowermost surface, and an outer peripheral thermal insulation portion which is provided to cover outer peripheral edges of the N-type semiconductor layer, the insulator layer, and the P-type semiconductor layer, and the upper high thermal conductive portion and the lower high thermal conductive portion may be formed of a material having a higher thermal conductivity than that of the outer peripheral thermal insulation portion.

That is, in the heat flow switching element, since the upper high thermal conductive portion and the lower high thermal conductive portion are formed of a material having a higher thermal conductivity than that of the outer peripheral thermal insulation portion, the heat flow in an in-plane direction can be curbed, and heat switch properties can be obtained in a laminating direction. In particular, when the N-side electrode and the P-side electrode are disposed on the outer periphery of each of the layers, introduction of heat into the electrodes can be curbed as much as possible by the outer peripheral thermal insulation portion having a low thermal conductivity.

In any one of the first to fourth inventions, a heat flow switching element of a sixth invention may further include an upper thermal insulation portion which is provided on an uppermost surface, a lower thermal insulation portion which is provided on a lowermost surface, and a pair of outer peripheral high thermal conductive portions which are partially provided at two locations separated from each other on outer peripheral edges of the N-type semiconductor layer, the insulator layer, and the P-type semiconductor layer, and the outer peripheral high thermal conductive portion may be formed of a material having a higher thermal conductivity than that of each of the upper thermal insulation portion and the lower thermal insulation portion.

That is, in the heat flow switching element, since the outer peripheral high thermal conductive portion is formed of a material having a higher thermal conductivity than that of each of the upper thermal insulation portion and the lower thermal insulation portion, the heat flow in the laminating direction can be curbed, and the heat switch properties can be obtained in the in-plane direction. In particular, when the N-side electrode and the P-side electrode are disposed on the outer periphery of each of the layers, contact thermal resistance between a high temperature side and a low temperature side can be reduced by covering the N-side electrode and the P-side electrode with the outer peripheral high thermal conductive portion having a high thermal conductivity.

According to a heat flow switching element of a seventh invention, in any one of the first to sixth inventions, the N-type semiconductor layer and the P-type semiconductor layer may be formed of a thin film having a thickness of less than 1 μm.

That is, in the heat flow switching element, since the N-type semiconductor layer and the P-type semiconductor layer may be formed of a thin film having a thickness of less than 1 μm, even when the thickness is 1 μm or more, an effect of electric charge generation does not change functionally, a useless portion which does not contribute to heat flow switching is reduced, and manufacturing cost and a thickness can be reduced.

According to the present invention, the following effects can be obtained.

That is, according to the heat flow switching element of the present invention, since the heat flow switching element includes an N-type semiconductor layer, an insulator layer laminated on the N-type semiconductor layer, and a P-type semiconductor layer laminated on the insulator layer, the amount of electric charges generated by application of an external voltage is large, and a large change in thermal conductivity and high thermal responsiveness can be obtained.

BRIEF DESCRIPTION OF THE DRAWINGS

FIG. 1 is a perspective view showing a first embodiment of a heat flow switching element according to the present invention.

FIG. 2 is a conceptual diagram for explaining a principle in the first embodiment.

FIG. 3 is a perspective view showing a second embodiment of the heat flow switching element according to the present invention.

FIG. 4 is a cross-sectional view showing the heat flow switching element in the second embodiment.

FIG. 5 is a cross-sectional view showing a third embodiment of the heat flow switching element according to the present invention.

FIG. 6 is a cross-sectional view showing a fourth embodiment of the heat flow switching element according to the present invention.

FIG. 7 is a cross-sectional view showing a fifth embodiment of the heat flow switching element according to the present invention.

FIG. 8 is a graph showing a time dependence of a surface temperature ($\Delta T/\Delta T_{MAX}$) when measurement is performed in a pulsed light heating thermoreflectance method (FF method) in Example 1 of the heat flow switching element according to the present invention.

FIG. 9 is a graph showing the time dependence of the surface temperature ($\Delta T/\Delta T_{MAX}$) when measurement is performed in the pulsed light heating thermoreflectance method (FF method) in Example 2 of the heat flow switching element according to the present invention.

DETAILED DESCRIPTION OF THE INVENTION

Hereinafter, a first embodiment of a heat flow switching element according to the present invention will be described with reference to FIGS. 1 and 2. In the drawings used in the following description, scale is appropriately changed as necessary to make each of parts recognizable or easily recognizable.

As shown in FIGS. 1 and 2, a heat flow switching element 1 of the embodiment includes an N-type semiconductor layer 3, an insulator layer 4 laminated on the N-type semiconductor layer 3, and a P-type semiconductor layer 5 laminated on the insulator layer 4.

Further, the heat flow switching element 1 of the embodiment includes an N-side electrode 6 connected to the N-type semiconductor layer 3 and a P-side electrode 7 connected to the P-type semiconductor layer 5.

Various film forming methods such as a sputtering method, pulsed laser deposition method, chemical vapor deposition and a molecular beam epitaxy method (a MBE method) are adopted as a film forming method.

When a voltage can be directly applied to the N-type semiconductor layer 3 and the P-type semiconductor layer 5, the N-side electrode 6 and the P-side electrode 7 are unnecessary.

Further, the heat flow switching element 1 of the embodiment includes an insulating substrate 2, and the N-side electrode 6 is formed on the substrate 2. That is, the N-side electrode 6, the N-type semiconductor layer 3, the insulator layer 4, the P-type semiconductor layer 5, and the P-side electrode 7 are laminated on the substrate 2 in this order. The layers may be laminated on the substrate 2 in the reverse order. Further, the substrate 2 itself may be used as the P-side electrode 7 or the N-side electrode 6.

An external power source V is connected to the N-side electrode 6 and the P-side electrode 7, and a voltage is applied. An arrow in FIG. 1 indicates a direction in which a voltage (an electric field) is applied.

The N-type semiconductor layer 3 and the P-type semiconductor layer 5 are formed as thin films having a thickness of less than 1 μm. In particular, since electric charges e (positive electric charges, negative electric charges) generated at and in the vicinity of an interface with the insulator layer 4 mainly accumulate in a thickness range of 5 to 10 nm, the N-type semiconductor layer 3 and the P-type semiconductor layer 5 are more preferably formed with a thickness of 100 nm or less. Also, the N-type semiconductor layer 3 and the P-type semiconductor layer 5 preferably have a thickness of 5 nm or more.

Further, a thickness of the insulator layer 4 is preferably 40 nm or more and is set to a thickness in which insulation breakdown does not occur. When the insulator layer 4 is too thick, it is difficult to carry the electric charges e. Thus, the insulator layer 4 preferably has a thickness of less than 1 μm.

In FIG. 2, the type of the electric charges e generated at and in the vicinity of the interface between the N-type semiconductor layer 3 and the insulator layer 4 are negative electrons (negative electric charges) generated at the side of N-type semiconductor layer 3 and positive holes (positive electric charges) generated at the side of the insulator layer 4. Further, the type of the electric charges e generated at and in the vicinity of the interface between the P-type semiconductor layer 5 and the insulator layer 4 are positive holes generated at the side of P-type semiconductor layer 5 and negative electrons generated at the side of the insulator layer 4. Negative electrons are indicated by white circles. Positive holes are indicated by black circles. (The positive holes are holes formed by lack of electrons in a valence band of a semiconductor and appear to have relatively positive electric charges.)

The N-type semiconductor layer 3 and the P-type semiconductor layer 5 are preferably made of a degenerate semiconductor material having a low lattice thermal conductivity. For example, a thermoelectric material such as Si—Ge system, a nitride semiconductor such as Cr—N system, or an oxide semiconductor such as $VO_2$ may be adopted. Also, N-type and P-type are set by adding N-type and P-type dopants to the semiconductor material.

The insulator layer 4 is preferably an insulating material having a low thermal conductivity, and an insulator such as $SiO_2$, a dielectric such as $HfO_2$ and $BiFeO_3$, or an organic material such as polyimide (PI) may be adopted. In particular, a dielectric material having a high dielectric constant is preferable.

For example, a glass substrate or the like can be adopted as the substrate 2.

The N-side electrode 6 and the P-side electrode 7 are formed of, for example, a metal such as Mo and Al.

As shown in FIG. 2, in the heat flow switching element 1 of the embodiment, since an electric field (a voltage) is applied and thermal conductive electric charges e are generated at and in the vicinity of the interface between the N-type semiconductor layer 3 and the insulator layer 4, the generated electric charges e carry heat, and thus the thermal conductivity changes.

The thermal conductivity is obtained by the following equation.

$$\text{Thermal conductivity} = \text{lattice thermal conductivity} + \text{electron thermal conductivity}$$

One of the two types of thermal conductivity which changes according to an amount of electric charges generated by applying an electric field (a voltage) is the electron thermal conductivity. Therefore, in the embodiment, a material having a small lattice thermal conductivity is suitable for obtaining a larger change in the thermal conductivity. Thus, in each of the N-type semiconductor layer 3, the insulator layer 4, and the P-type semiconductor layer 5, a material having a small lattice thermal conductivity, that is, a material having a small thermal conductivity is selected.

A thermal conductivity of the material constituting each of the layers of the embodiment is preferably as low as 5 W/mK or less, more preferably 1 W/mK or less, and the above-described materials can be employed.

Further, the electron thermal conductivity increases in accordance with the amount of electric charges e generated according to an applied external electric field (a voltage).

Since the electric charges e are generated at the interfaces between the N-type semiconductor layer 3 and the P-type semiconductor layer 5 and the insulator layer 4, between the N-type semiconductor layer 3 and the insulator layer 4, and at the interfaces between the P-type semiconductor layer 5 and the insulator layer 4, respectively, the amount of the generated electric charges e can be increased by increasing a total area of the interface.

A method for measuring the thermal conductivity is performed, for example, by a pulsed light heating thermoreflectance method which is a method in which a thin film sample formed on a substrate is instantaneously heated with a pulsed laser, and a rate of decrease in a surface temperature or a rate of increase in the surface temperature due to thermal diffusion to the inside of the thin film is measured, and thus thermal diffusivity or thermal effusivity in a thickness direction of the thin film is determined. In a method of directly measuring the thermal diffusion (a rear surface heating—front surface temperature detection (RF) method) among the above-described pulsed light heating thermoreflectance methods, since it is necessary to use a transparent substrate through which a pulsed laser can be transmitted, when the substrate is not a transparent substrate, the thermal conductivity is measured by front surface heating—front surface temperature detection (FF) method in which the thermal effusivity is measured and then converted into the thermal conductivity. Also, this measurement requires a metal film, and Mo, Al, or the like is adopted.

As described above, since the heat flow switching element 1 of the embodiment includes the N-type semiconductor layer 3, the insulator layer 4 laminated on the N-type semiconductor layer 3, and the P-type semiconductor layer 5 laminated on the insulator layer 4, when a voltage is applied to the N-side electrode 6 and the P-side electrode 7, the electric charges e are induced mainly to the interfaces between the P-type semiconductor layer 5 and the N-type semiconductor layer 3 and the insulator layer 4, and the electric conductivity changes as the electric charges e carry the heat.

In particular, since the electric charges e are generated at both the interface between the N-type semiconductor layer 3 and the insulator layer 4 and the vicinity thereof and the interface between the P-type semiconductor layer 5 and the insulator layer 4 and the vicinity thereof, the amount of generated electric charges is large, and a large change in the thermal conductivity and high thermal responsiveness can be obtained. In addition, since it is a mechanism which physically changes the thermal conductivity without using a chemical reaction mechanism, a shift toward a state in which the thermal conductivity has changed can be immediately performed, and good thermal responsiveness can be obtained.

Also, since the amount of electric charges induced to the interfaces changes according to a magnitude of the external voltage, the thermal conductivity can be adjusted by adjusting the external voltage, and a heat flow can be actively controlled through the element.

Since the insulator layer 4 has an electric insulation characteristics, and an electric current due to voltage application is not generated, Joule heat does not occur due to the voltage application. Therefore, the heat flow can be actively controlled without self-heating.

Also, since the insulator layer 4 is formed of a dielectric, the electric charges are also generated on the insulator layer 4 side, which is a dielectric, at the interfaces between the N-type semiconductor layer 3 and the P-type semiconductor layer 5 and the insulator layer 4, and a larger change in the thermal conductivity and higher thermal responsiveness can be achieved.

Further, since the N-type semiconductor layer 3 and the P-type semiconductor layer 5 are formed as thin films having a thickness of less than 1 μm, and the effect of electric charge generation does not change functionally even when the thickness is 1 μm or more, useless portions which do not contribute to heat flow switching are reduced, and thus manufacturing cost and the thickness can be reduced.

Next, second to fifth embodiments of the heat flow switching element according to the present invention will be described below with reference to FIGS. 3 to 7. In the following description of each of the embodiments, the same components described in the above-described embodiment will be designated by the same reference numerals, and description thereof will be omitted.

A difference between the second embodiment and the first embodiment is that the N-type semiconductor layer 3, the insulator layer 4, and the P-type semiconductor layer 5 are laminated one by one in the first embodiment, but a plurality of N-type semiconductor layers 23 and P-type semiconductor layers 25 are alternately laminated with the insulator layer 24 interposed therebetween in a heat flow switching element 21 of the second embodiment, as shown in FIGS. 3 and 4.

That is, in the second embodiment, first, the insulator layer 24 is formed on the substrate 2, the N-type semiconductor layer 23 and the P-type semiconductor layer 25 are repeatedly laminated thereon in this order with the insulator layer 24 interposed therebetween, and a laminate body including three N-type semiconductor layers 23, three P-type semiconductor layers 25, and seven insulator layers 24 is formed.

Each of the N-type semiconductor layers 23 is connected to an N-side connection portion 23a provided at a base end portion, and the N-side electrode 26 is formed on a part of the N-side connection portion 23a. Further, each of the P-type semiconductor layers 25 is connected to a P-side connection portion 25a provided at the base end portion, and the P-side electrode 27 is also formed on a part of the P-side connection portion 25a.

Each of the above layers is patterned using a metal mask. A plurality of N-type semiconductor layers 23, P-type semiconductor layers 25, and insulator layers 24 are laminated by forming a film while a position of the metal mask is shifted.

Further, lead wires 26a and 27a are respectively connected to the N-side electrode 26 and the P-side electrode 27.

As described above, in the heat flow switching element 21 according to the second embodiment, since the N-type semiconductor layers 23 and the P-type semiconductor layers 25 are alternately laminated with the insulator layer 24 interposed therebetween, the electric charges e generated along the interfaces of which the number is increased by the lamination also increases due to the external voltage, and a larger change in the thermal conductivity and higher thermal responsiveness can be obtained.

Next, a difference between the third embodiment and the second embodiment is that the insulator layer 24 is exposed on the uppermost and the substrate 2 on the lowermost surface is a glass substrate in the second embodiment, but a heat flow switching element 31 of the third embodiment includes an upper high thermal conductive portion 38 provided on the uppermost surface, a lower high thermal conductive portion 32 of the substrate provided on the lowermost surface, and an outer peripheral thermal insulation portion 39 provided to cover outer peripheral edges of the N-type semiconductor layer 23, the insulator layer 24, and the P-type semiconductor layer 25, and the upper high thermal conductive portion 38 and the lower high thermal conductive portion 32 are formed of a material having a higher thermal conductivity than that of the outer peripheral thermal insulation portion 39, as shown in FIG. 5.

For example, the upper high thermal conductive portion 38 is formed of a high thermal conductive material such as a silicon resin (silicone), and the lower high thermal conductive portion 32 is formed of a high thermal conductive substrate made of alumina or the like.

Further, the outer peripheral thermal insulation portion 39 is formed of a low thermal conductive material such as an epoxy resin.

The outer peripheral thermal insulation portion 39 covers the periphery of a portion of the uppermost insulator layer 24 in a state in which the portion of the uppermost insulator layer 24 is exposed, and the upper high thermal conductive portion 38 is formed on the upper side to be in contact with the exposed uppermost insulator layer 24.

The outer peripheral thermal insulation portion 39 is formed to cover the N-side electrode 26 and the P-side electrode 27 which are disposed on an outer periphery of each of the layers and are connected to the lead wires 26a and 27a.

In the case of the third embodiment, a heat flow direction is a laminating direction (a direction of an arrow in FIG. 5), and for example, the upper high thermal conductive portion 38 side is a high temperature side, and the lower high thermal conductive portion 32 side is a low temperature side. When the heat flow direction is the laminating direction, the upper high thermal conductive portion 38 side may be the low temperature side, and the lower high thermal conductive portion 32 side may be the high temperature side.

As described above, in the heat flow switching element 31 of the third embodiment, since the upper high thermal conductive portion 38 on the uppermost surface and the lower high thermal conductive portion 32 on the lowermost surface are formed of a material having a higher thermal conductivity than that of the outer peripheral thermal insulation portion 39, and while the entirety of the N-type semiconductor layer 23, the insulator layer 24 and the P-type semiconductor layer 25 is used as a heat flow path, flowing of heat through the outer peripheral thermal insulation portion 39 in which the thermal conductivity does not change can be curbed, thermal switch properties can be obtained in the laminating direction. In addition, since both the upper high thermal conductive portion 38 and the lower high thermal conductive portion 32 have an device structure in which flatness can be easily obtained, the high temperature side and the low temperature side are easily in thermal contact with each other, and contact thermal resistance between the high temperature side and the low temperature side can be reduced.

Next, a difference between the fourth embodiment and the third embodiment is that the upper high thermal conductive portion 38 and the lower high thermal conductive portion 32 are formed of a material having a higher thermal conductivity than that of the outer peripheral thermal insulation portion 39 in the third embodiment, but a heat flow switching element 41 of the fourth embodiment includes an upper thermal insulation portion 48 provided on the uppermost surface, a lower thermal insulation portion 42 provided on the lowermost surface, and a pair of outer peripheral high thermal conductive portions 49 partially provided at two locations separated from each other on outer peripheral edges of the N-type semiconductor layer 23, the insulator layer 24, and the P-type semiconductor layer 25, and the outer peripheral high thermal conductive portion 49 is formed of a material having a higher thermal conductivity than that of each of the upper thermal insulation portion 48 and the lower thermal insulation portion 42, as shown in FIG. 6.

For example, the upper thermal insulation portion 48 is formed of a low thermal conductive material such as an epoxy resin, and the lower thermal insulation portion 42 is formed of a low thermal conductive substrate such as glass.

Further, the pair of outer peripheral high thermal conductive portions 49 are formed of a high thermal conductive material such as a silicon-based resin (silicone).

The pair of outer peripheral high thermal conductive portions 49 cover the periphery of a portion of the uppermost insulator layer 24 in a state in which the portion of the uppermost insulator layer 24 is exposed and are formed to be spaced apart from each other in an outer peripheral direction.

The upper thermal insulation portion 48 is formed on the upper side to be in contact with the exposed uppermost insulator layer 4.

The pair of outer peripheral high thermal conductive portions 49 are formed to cover the N-side electrode 26 and the P-side electrode 27 which are disposed on the outer periphery of each of the layers and connected to the lead wires 26a and 27a.

In the case of the fourth embodiment, the heat flow direction is an in-plane direction (a direction of an arrow in FIG. 6), and one of the pairs of outer peripheral high thermal conductive portions 49 is the high temperature side, and the other side is the low temperature side. That is, the pair of outer peripheral high thermal conductive portions 49 are disposed separately on the high temperature side and the low temperature side in the heat flow direction.

As described above, in the heat flow switching element 41 of the fourth embodiment, since the outer peripheral high thermal conductive portion 49 is formed of a material having a higher thermal conductivity than that of each of the upper thermal insulation portion 48 and the lower thermal insulation portion 42, and thus while the entirety of the N-type semiconductor layer 23, the insulator layer 24, and the P-type semiconductor layer 25 is used as a heat flow path, flowing of heat through the upper thermal insulation portion 48 and the lower thermal insulation portion 42 in which the thermal conductivity does not change can be curbed, heat flow switch properties can be obtained in the in-plane direction. When the N-side electrode 26 and the P-side electrode 27 are disposed on the outer periphery of each of the layers, by covering the N-side electrode 26 and the P-side electrode 27 with the outer peripheral high thermal conductive portion 49 having high thermal conductivity, the high temperature side and the low temperature side can be easily in thermal contact with each other via the outer peripheral high thermal conductive portion 49, and thus contact thermal resistance between the high temperature side and the low temperature side can be reduced.

Next, a difference between the fifth embodiment and the second embodiment is that each of the N-type semiconductor layers 23 is connected to the N-side connection portion 23a, and the N-side electrode 26 is formed on a part of the N-side connection portion 23a, and each of the P-type semiconductor layers 25 is connected to the P-side connection portion 25a, and the P-side electrode 27 is formed on a part of the P-side connection portion 25a in the second embodiment, but in a heat flow switching element 51 of the fifth embodiment, as shown in FIG. 7, a base end portion of each of the N-type semiconductor layers 23 is connected to the N-side electrode 56 formed at a side portion, and a base end portion of each of the P-type semiconductor layers 25 is connected to a P-side electrode 57 formed on the side portion.

In the fifth embodiment, the lead wires 26a and 27a are respectively connected to a part of the N-side electrode 56 and a part of the P-side electrode 57.

As described above, in the heat flow switching element 51 of the fifth embodiment, since the N-side electrode 56 is formed at the base end portion of each of the N-type semiconductor layers 23, and the P-side electrode 57 is formed at the base end portion of each of the P-type semiconductor layers 25, for example, when the N-side electrode 56 and the P-side electrode 57 are formed of a material having a high thermal conductivity such as a metal, thermal switch properties can be obtained in a direction between the electrodes disposed at the side portion.

Further, since the electrodes are disposed at the side portion, when a metal material or the like having a high thermal conductivity is used for the N-side electrode 56 and the P-side electrode 57, heat switch properties can be obtained inward by configuring the outer peripheral high thermal conductive portion 49 with a material having a higher thermal conductivity than that of each of the upper thermal insulation portion 48 and the lower thermal insulation portion 42, as in the fourth embodiment.

EXAMPLES

Example 1

An insulator layer, a P-type semiconductor layer, and a P-side electrode were laminated on an N-type semiconductor layer using the following materials to form Example 1 of the present invention, and a change in the thermal conductivity was measured.

N-type semiconductor layer: Si substrate of N-type semiconductor (thickness of 0.5 mm)

Insulator layer: $SiO_2$ (thickness of 100 nm)

P-type semiconductor layer: $Si_{0.375}Ge_{0.575}Au_{0.05}$ (thickness of 40 nm)

P-side electrode: Mo (thickness of 100 nm)

It has been confirmed that each of $SiO_2$ (thickness of 100 nm) and $Si_{0.375}Ge_{0.575}Au_{0.05}$ (thickness of 40 nm) has a thermal conductivity of less than 2 W/mK in a single film.

Further, $SiO_2$ (thickness of 100 nm) was formed by an RF sputtering method, and $Si_{0.375}Ge_{0.575}Au_{0.05}$ (thickness of 40 nm) was formed by an MBE method.

An Au wire was connected to the Si substrate of the N-type semiconductor and Mo of the P-side electrode, and a voltage was applied. Further, the measurement was performed at room temperature.

For the measurement, a thermal effusivity with respect to the voltage and a rate of increase in the thermal conductivity after voltage application are shown in the following Table 1 and FIG. 8.

TABLE 1

| Voltage(V) | Thermal effusivity (W/$s^{0.5}m^2$K) | Rate of increase in thermal conductivity after voltage application (%) |
|---|---|---|
| 0 | 899.9 | 0.0% |
| 1 | 901.6 | 0.4% |
| 5 | 990.5 | 21.2% |
| 10 | 965.2 | 15.1% |
| 25 | 982.7 | 19.3% |
| 50 | 1027.0 | 30.0% |

Example 2

An N-type semiconductor layer, an insulator layer, a P-type semiconductor layer, and a P-side electrode were laminated on a substrate using the following materials to form Example 2 of the present invention, and a change in the thermal conductivity was measured.

Substrate: glass substrate (thickness of 0.5 mm)

N-type semiconductor layer: $Si_{0.36}Ge_{0.56}P_{0.08}$ (thickness of 40 nm)

Insulator layer: $SiO_2$ (thickness of 30 nm)

P-type semiconductor layer: $Si_{0.375}Ge_{0.575}Au_{0.05}$ (thickness of 20 nm)

P-side electrode: Mo (thickness of 100 nm)

It has been confirmed that each of $Si_{0.36}Ge_{0.56}P_{0.08}$ (thickness of 40 nm), $SiO_2$ (thickness of 30 nm) and $Si_{0.375}Ge_{0.575}Au_{0.05}$ (thickness of 20 nm) has a thermal conductivity of less than 2 W/mK in a single film.

Further, $SiO_2$ (thickness of 30 nm) was formed by an RF sputtering method, and $Si_{0.36}Ge_{0.56}P_{0.08}$ (thickness of 40 nm) and $Si_{0.375}Ge_{0.575}Au_{0.05}$ (thickness of 20 nm) were formed by an MBE method.

An Au wire was connected to $Si_{0.36}Ge_{0.56}P_{0.08}$ of the N-type semiconductor and Mo of the P-side electrode, and a voltage was applied. Further, the measurement was performed at room temperature.

For the measurement, a thermal effusivity with respect to the voltage and a rate of increase in the thermal conductivity after voltage application are shown in the following Table 2 and FIG. 9.

TABLE 2

| Voltage(V) | Thermal effusivity (W/$s^{0.5}m^2$K) | Rate of increase in thermal conductivity after voltage application (%) |
|---|---|---|
| 0 | 744.8 | 0.0% |
| 1 | 862.9 | 34.2% |
| 3 | 912.8 | 50.2% |
| 5 | 907.8 | 48.6% |
| 8 | 932.3 | 56.7% |

The thermal effusivity was measured by the FF method (front surface heating/front surface temperature detection) of the pulsed light heating thermoreflectance method (measurement device: PicoTherm Corporation, PicoTR).

The thermal conductivity is calculated from the thermal effusivity by the following equation.

$$\text{Thermal conductivity } k = (\text{thermal effusivity } b)^2 / \text{volume heat capacity}$$
$$= (\text{thermal effusivity } b)^2 / (\text{specific heat} \times \text{density})$$

Therefore, the rate of increase Δk in thermal conductivity after voltage application is evaluated by the following equation.

$$\Delta k = k(V)/k(0) - 1$$

$$\Delta k = b(V)^2/b(0)^2 - 1$$

k(V): thermal conductivity when voltage is applied (W/mK)

k(0): thermal conductivity without voltage application (W/mK)

b(V): thermal effusivity when voltage is applied (W/$s^{0.5}m^2$K)

b(0): thermal effusivity without voltage application (W/$s^{0.5}m^2$K)

In the measurement using the pulsed light heating thermoreflectance method (the FF method), the element is instantaneously heated with a pulsed laser from the Mo film side of the P-side electrode, and a rate of decrease in a surface temperature due to the thermal diffusion into the inside of the thin film is measured, and thus the thermal effusivity of the thin film is measured.

When the thermal effusivity is large, that is, when the thermal conductivity is large, a heat transfer becomes larger, and a time for lowering temperature becomes faster.

FIGS. 8 and 9 show time dependency of the surface temperature. The surface temperature on the vertical axis is standardized (maximum 1) at the maximum temperature when heated by a pulsed laser.

As a result of these measurements, in both Examples 1 and 2, it was confirmed that, as the applied voltage becomes higher, the thermal effusivity was increased, and the rate of increase in the thermal conductivity after voltage application was increased. That is, it can be understood from the results shown in FIGS. 8 and 9 that, when the voltage is applied, a speed of decrease in the surface temperature is faster, and the thermal effusivity is higher, that is, the thermal conductivity is higher than in a case in which the voltage is not applied. It was confirmed that Joule heat according to the voltage application did not occur due to the presence of insulator layer, and the thermal conductivity could be physically and actively controlled without self-heating.

The technical scope of the present invention is not limited to the above embodiments, and various changes can be made without departing from the spirit of the present invention.

EXPLANATION OF REFERENCES

1, 21, 31, 41, 51 Heat flow switching element
3, 23 N-type semiconductor layer
4, 24 Insulator layer
5, 25 P-type semiconductor layer
6, 26, 56 N-side electrode
7, 27, 57 P-side electrode
32 Lower high thermal conductive portion
42 Lower thermal insulation portion
38 Upper high thermal conductive portion
48 Upper thermal insulation portion
39 Outer peripheral thermal insulation portion
49 Outer peripheral high thermal conductive portion

What is claimed is:

1. A heat flow switching element comprising:
    an N-type semiconductor layer;
    an insulator layer which is laminated on the N-type semiconductor layer;
    a P-type semiconductor layer which is laminated on the insulator layer;
    an N-side electrode which is connected to the N-type semiconductor layer; and
    a P-side electrode which is connected to the P-type semiconductor layer,
    wherein the N-type semiconductor layer and the P-type semiconductor layer are electrically insulated by the insulator layer disposed therebetween, and
    a thermal conductivity of the heat flow switching element is changed by applying an external voltage to the N-side electrode and the P-side electrode.

2. The heat flow switching element according to claim 1, wherein the insulator layer is formed of a dielectric.

3. The heat flow switching element according to claim 1, wherein a plurality of N-type semiconductor layers and P-type semiconductor layers are alternately laminated with the insulator layer interposed therebetween.

4. The heat flow switching element according to claim 1, further comprising:
    an upper high thermal conductive portion which is provided on an uppermost surface,
    a lower high thermal conductive portion which is provided on a lowermost surface, and
    an outer peripheral thermal insulation portion which is provided to cover outer peripheral edges of the N-type semiconductor layer, the insulator layer, and the P-type semiconductor layer,
    wherein the upper high thermal conductive portion and the lower high thermal conductive portion are formed of a material having a higher heat conductivity than that of the outer peripheral thermal insulation portion.

5. The heat flow switching element according to claim 1, further comprising:
    an upper thermal insulation portion which is provided on an uppermost surface,
    a lower thermal insulation portion which is provided on a lowermost surface, and
    a pair of outer peripheral high thermal conductive portions which are partially provided at two locations separated from each other on outer peripheral edges of the N-type semiconductor layer, the insulator layer, and the P-type semiconductor layer,
    wherein the outer peripheral high thermal conductive portion is formed of a material having a higher thermal conductivity than that of each of the upper thermal insulation portion and the lower thermal insulation portion.

6. The heat flow switching element according to claim 1, wherein the N-type semiconductor layer and the P-type semiconductor layer are formed of a thin film having a thickness of less than 1 µm.

* * * * *